United States Patent
Bahl et al.

[11] Patent Number: 5,965,935
[45] Date of Patent: *Oct. 12, 1999

[54] LOW LOSS RIDGED MICROSTRIP LINE FOR MONOLITHIC MICROWAVE INTEGRATED CIRCUIT (MMIC) APPLICATIONS

[75] Inventors: Inder J. Bahl; Edward L. Griffin, both of Roanoke, Va.

[73] Assignee: ITT Industries, Inc., White Plains, N.Y.

[*] Notice: This patent is subject to a terminal disclaimer.

[21] Appl. No.: 08/964,735

[22] Filed: Nov. 5, 1997

Related U.S. Application Data

[63] Continuation of application No. 08/693,868, Aug. 5, 1996, Pat. No. 5,753,968.

[51] Int. Cl.⁶ .................................................. H01L 29/41
[52] U.S. Cl. .......................... 257/664; 257/642; 257/643; 257/631; 257/632
[58] Field of Search ..................................... 257/664, 642, 257/643, 631, 632, 792, 410, 411

[56] References Cited

U.S. PATENT DOCUMENTS

| | | | |
|---|---|---|---|
| 5,357,138 | 10/1994 | Kobayshi | 257/664 |
| 5,567,982 | 10/1996 | Bartelink | 257/664 |
| 5,602,421 | 2/1997 | Li | 257/664 |
| 5,753,968 | 5/1998 | Bahl et al. | 257/664 |

*Primary Examiner*—David B. Hardy
*Attorney, Agent, or Firm*—Arthur L. Plevy

[57] ABSTRACT

A microstrip line device is disclosed of the type which typically includes a strip conductor disposed on the top of a substrate. The device further includes a layer of dielectric material disposed between the strip conductor and the substrate for reducing the dissipation loss in these devices. In order to accomplish this, the dielectric layer has a dielectric constant which is less than the dielectric constant of the substrate.

6 Claims, 2 Drawing Sheets

LOW LOSS RIDGED MICROSTRIP LINE FOR MONOLITHIC MICROWAVE INTEGRATED CIRCUIT (MMIC) APPLICATIONS

This is a continuation of application Ser. No. 08/693,868, filed Aug. 5, 1996, now U.S. Pat. No. 5,753,968.

BACKGROUND OF THE INVENTION

The present invention relates generally to microstrip lines, and more particularly to a microstrip line including an additional dielectric layer for reducing the dissipation loss in microwave circuit applications.

DESCRIPTION OF THE PRIOR ART

Transmission lines are an important element in microwave circuit applications. These devices provide interconnection between the active and passive devices of such circuits, and are utilized as impedance matching elements as well. Further, the configuration of transmission lines influence the substrate thickness, circuit geometry, thermal impedance and packaging considerations of circuits that incorporate these devices.

A microstrip line is a type of transmission line which is widely utilized in Monolithic Microwave Integrated Circuit (MMIC) applications. An example of a conventional microstrip line is shown in FIG. 1. Such a device 10 typically includes a strip conductor 12 having a width w and a thickness t, which is disposed over a dielectric substrate 14. The substrate 14 very often is fabricated from Gallium Arsenide (GaAs) material when utilized in microwave circuits. The lower surface of the substrate 14 is coated with additional conducting or metallized material to form a ground plane 16.

Microstrip lines have a number of advantages when utilized in MMIC applications. First of all, these devices have a configuration which is readily adaptable to IC fabrication since these devices include planes of conducting material disposed on a substrate. These devices also enable passive as well as active elements of a circuit to be easily inserted in series on the surface of an IC. Additionally, the ground plane located on the lower surface of the substrate provides a mounting surface as well as a heat sink for the active devices included in the circuit.

A current trend in MMIC technology is to reduce the dissipation loss in microstrip lines, which is the power lost due to the internal impedance of these devices. One reason for this trend is that there is an increasing demand to reduce the dissipation loss in matching networks in order to improve the noise figure in low noise amplifiers and the power added efficiency performance in power amplifiers. Microstrip lines play an important role since these matching networks utilize distributed elements which in reality are microstrip lines. Low loss microstrip lines are also very desirable in order to realize low loss passive components such as narrow band filters, baluns, dividers/combiners and couplers.

Several techniques have been developed in order to reduce the dissipation loss in MMIC applications. The techniques developed include valley microstrip lines, high impedance coplanar waveguides and micromachined/microshield microstrips. Although, the above techniques have successfully reduced the dissipation loss in MMIC applications, such techniques are not as desirable to use as conventional microstrip lines. This is because these techniques produce structures that require special fabrication techniques or structures that are not as flexible as microstrip lines.

It is therefore, an object of the present invention to provide a microstrip line with an improved structure for reducing the dissipation loss, which is also compatible with conventional MMIC fabrication processes.

SUMMARY OF THE INVENTION

A microstrip line device is disclosed of the type which typically includes a strip conductor disposed on the top of a substrate. The device further includes a layer of dielectric material disposed between the strip conductor and the substrate for reducing the dissipation loss in these devices. In order to accomplish this, the dielectric layer has a dielectric constant which is less than the dielectric constant of the substrate.

It is further disclosed that in a preferred embodiment, the dielectric layer is a layer of polyimide material having a thickness in the range of 5 to 15 $\mu$m, wherein the dissipation loss is reduced by a half in such a structure.

BRIEF DESCRIPTION OF THE DRAWING

The above objects, further features and advantages of the present invention are described in detail below in conjunction with the drawings, of which.

DETAILED DESCRIPTION OF THE DRAWING

The present invention is directed to a microstrip line having a modified structure, which is utilized to reduce the dissipation loss in microstrip matching networks. The modified structure includes disposing an additional layer of dielectric material between the substrate and strip conductor of a conventional microstrip line.

As previously discussed, reducing the dissipation loss in microstrip lines is desirable in a number of applications. These include matching networks for improving the noise figure in low noise amplifiers and the power added efficiency performance in power amplifiers. Low loss microstrip lines are also very desirable in order to realize low loss passive components such as narrow band filters, baluns, dividers/combiners and couplers.

Figure 1:
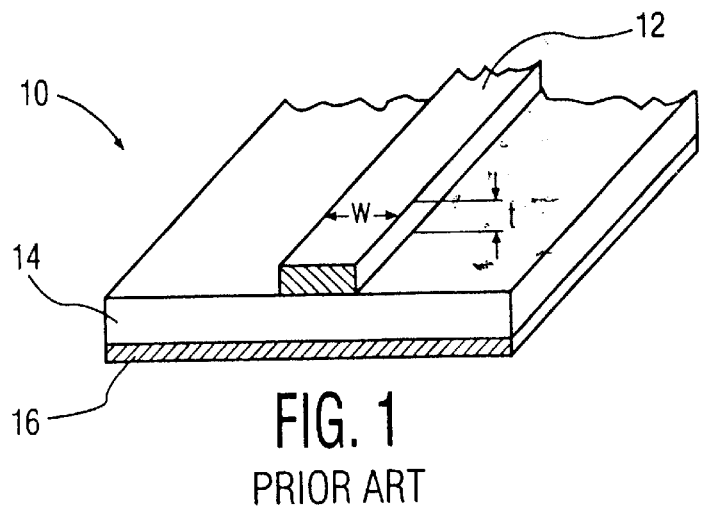
FIG. 1 is a diagram of a conventional microstrip line.
Figure 2:
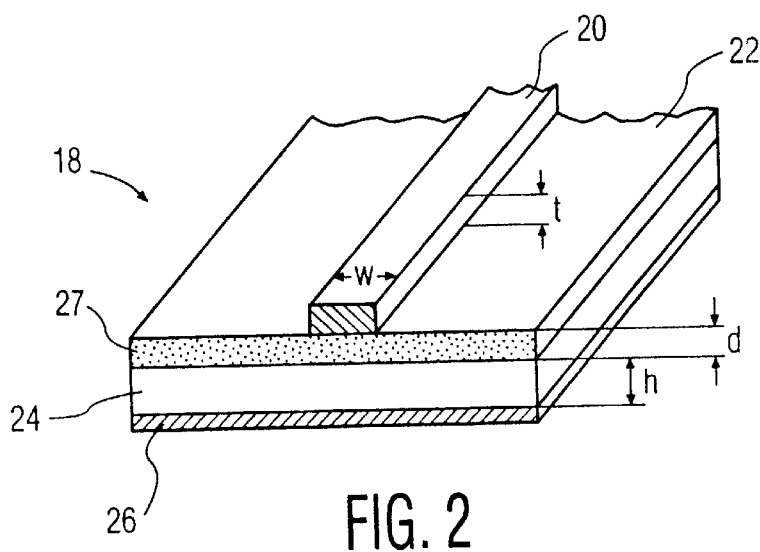
FIG. 2 is a diagram of the ridged microstrip line according to the present invention.

Referring to FIG. 2, there is shown a diagram of the ridged microstrip line according to the present invention. The ridged microstrip line 18 includes a strip conductor 20 having a width w and a thickness t. The strip conductor 20 is disposed over a top surface of a dielectric substrate 24 having a thickness h. The other surface of the substrate 24 is coated with additional conducting or metallized material to form a ground plane 26. The microstrip line 18 further includes a dielectric buffer layer 27 having a thickness d, which is disposed between the strip conductor 20 and substrate 24. Thus, in the present invention the strip conductor 20 is now fabricated on an additional dielectric layer 27, which is placed on top of the substrate 24. Such a configuration is compatible with standard MMIC fabrication processes since depositing layers of material is encompassed by these processes.

The additional dielectric layer 27 is utilized in the present invention in order to substantially reduce the dissipation loss of the microstrip line 18. This is accomplished when the dielectric layer 27 has a permittivity less than that of the material utilized as the substrate 24. Such a configuration causes the electric flux lines to be raised higher in the air and thus makes the structure resemble a suspended microstrip line which has much lower dissipation loss.

The permittivity is defined as the property which describes the electric flux density produced when the material is excited by an electrical potential. Absolute permittivity is the ratio of the electric flux density produced by an electric field. While relative permittivity is the ratio of electric flux density produced in a material to the value in free space produced by the same electric field strength. Relative permittivity is also known as the dielectric constant of a material. Therefore, in order for the dielectric layer 27 to reduce the dissipation loss of the microstrip line 18, it must have a dielectric constant which is less than that of the substrate 24.

In the present invention, the dielectric layer 27 can be any material which has a dielectric constant less than that of the substrate material. However, polyimide material is preferred, which is a material utilized in various other electronic packaging applications. Thin films of this material can be spin cast or sprayed for use as IC passivation layers, while thicker films are used for flexible laminates. Polyimides exhibit desirable mechanical and electrical properties as well as high temperature properties.

Most commonly, polyimide films are cast as polyamic acid solutions which are thermally dehydrated to form the final polymer. Proper curing is necessary in order to obtain the best mechanical and electrical properties. The cured polymers are generally insoluble intractable materials, but such materials are not crosslinked. This distinction is important since polyimides with a modified chemical structure can be soluble.

In the present invention, the dielectric layer 27 is preferably a thin layer of polyimide material having a thickness d in the range of 5 to 15 $\mu$m. Preferably the substrate 24 should also be fabricated from GaAs material having a thickness h of 75 $\mu$m, while the strip conductor 20 preferably has a thickness t of 4.5 $\mu$m. The dielectric constants of the GaAs substrate 24 and the polyimide dielectric layer 27 preferably is 12.9 and 3.0, respectively. Such a choice of materials reduce the dissipation loss of the microstrip line 18 by a half, which is substantial. Also, in a MMIC made according to the present invention, except for the microstrip and inductor conductors, all of the other components such as FETs, diodes, capacitors, resistors and via holes are formed on the GaAs material.

Figure 3:
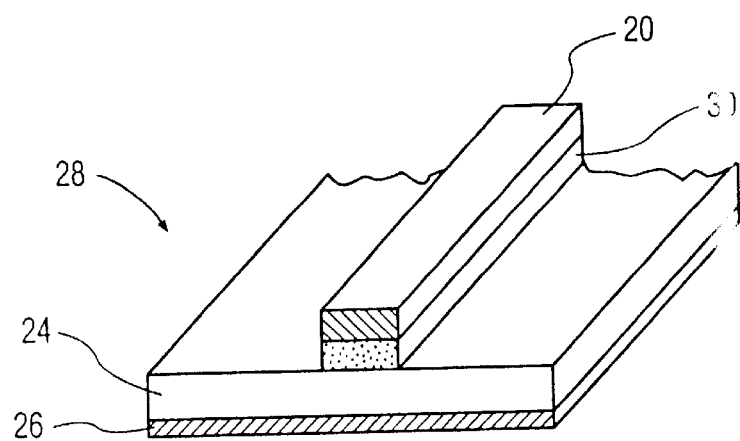
FIG. 3 is a diagram of an alternative embodiment of the ridged microstrip line according to the present invention.

Referring to FIG. 3, a diagram of an alternative embodiment of the ridged microstrip line according to the present invention is shown. This embodiment 28 is similar to the embodiment described in regard to FIG. 2 except for the dielectric layer 30, as such like numerals implies like elements. In this embodiment of the ridged microstrip line 28 the dielectric layer 30 has been etched to have a width equal to the width of the strip conductor 20. This is accomplished by etching away the surrounding material which is preferably a polyimide material. This embodiment 28 provides further improvement in the reduction of the dissipation loss since more of the microstrip line 28 is surrounded by air as shown in FIG. 3.

Figure 4:
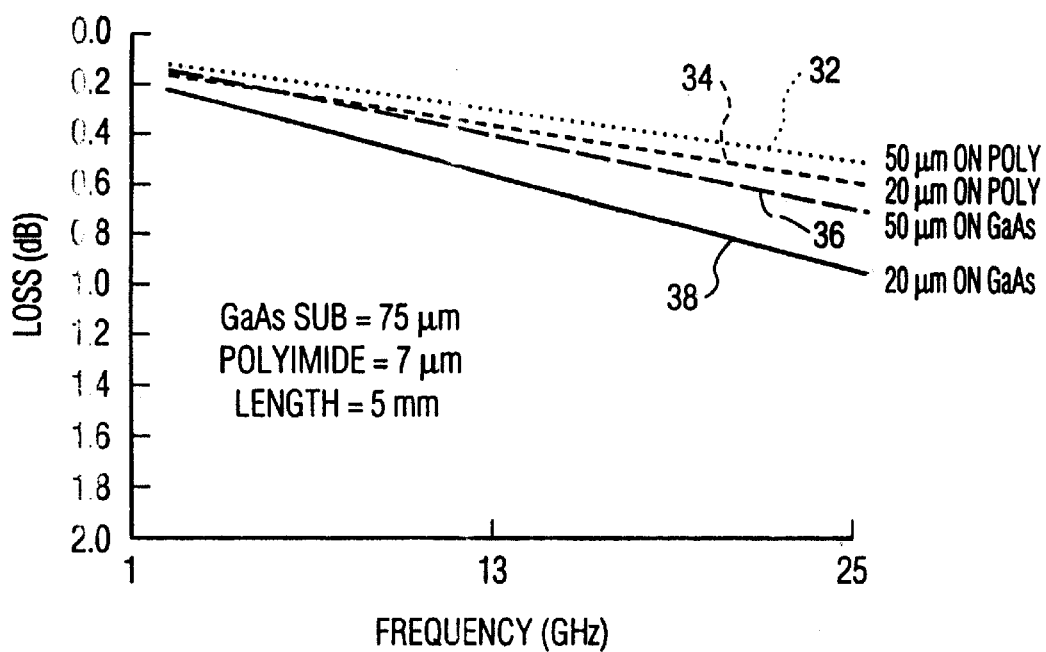
FIG. 4 is a graph plotting the dissipation loss for various microstrip line configurations.

Referring to FIG. 4, there is shown a graph plotting the dissipation loss for various microstrip line configurations. This graph plots the power lost in dBs as a function of the frequency of the signal carried by a number of different microstrip configurations. Curves 32 & 34 represent microstrip lines configured according to the preferred embodiment as described in conjunction with FIG. 2, while Curves 36 & 38 represent conventionally configured microstrip lines without any additional dielectric layers. Additionally, the microstrip line of Curves 32 & 36 include strip conductors with a width of 50 $\mu$m, while the microstrip line of Curves 34 & 38 include strip conductors with a width of 20 $\mu$m.

As previously described, the preferred embodiment included a GaAs substrate having a thickness of 75 $\mu$m and a layer of polyimide material inserted between the strip conductor and substrate of a conventional microstrip. For Curves 32 & 34 the polyimide layer has a thickness of 7 $\mu$m. In comparing Curves 32, 34, 36 & 38, it can be seen that the addition of the polyimide layer reduces the dissipation loss approximately by a half.

Thus, it has been demonstrated that a new low loss microstrip line is obtainable by inserting an additional dielectric layer which is preferably polyimide material between the top conductor of the microstrip line and substrate. Such a low loss microstrip has potential applications for low noise and high efficiency amplifiers as well as low loss passive components.

While the invention has been particularly shown and described with reference to preferred embodiments thereof, it will be understood by those skilled in the art that changes in form and details may be made therein without departing from the spirit and scope of the present invention.

What is claimed is:

1. A microstrip line device of the type which typically includes a strip conductor disposed on the top of a substrate, wherein the improvement therewith comprising:

A layer of dielectric material disposed entirely between said strip conductor and said substrate, said dielectric layer having a top surface in direct contact with said strip conductor, and a bottom surface in direct contact with said substrate, wherein said dielectric layer has a dielectric constant which is less than the dielectric constant of said substrate.

2. A microstrip line device, comprising:

a substrate;

a strip conductor; and a layer of dielectric material disposed entirely between said strip conductor and said substrate, said dielectric layer having a top surface in direct contact with said strip conductor, and a bottom surface in direct contact with said substrate along the entire width of said substrate, wherein said dielectric layer has a dielectric constant which is less than the dielectric constant of said substrate.

3. A method for reducing the dissipation loss of a microstrip line typically including a strip conductor disposed on the top of a substrate, said method comprising the steps of:

inserting a layer of dielectric material directly between said strip conductor and said substrate such that said dielectric layer is in direct contact with said strip conductor along a top surface, and in direct contact with said substrate along a bottom surface, wherein said dielectric layer has a dielectric constant which is less than the dielectric constant of said substrate.

4. A microstrip line device of the type which typically includes a strip conductor disposed on the top of a substrate, wherein the improvement therewith comprising:

A layer of dielectric material disposed between said strip conductor and said substrate, wherein said dielectric layer has a dielectric constant which is less than the dielectric constant of said substrate and wherein said dielectric layer has a width no greater than the width of said strip conductor.

5. A microstrip line device, comprising:

a substrate;

a strip conductor; and a layer of dielectric material disposed between said strip conductor and said substrate, wherein said dielectric layer has a dielectric constant which is less than the dielectric constant of said substrate, and wherein said dielectric layer has a width no greater than the width of said strip conductor.

6. A method for reducing the dissipation loss of a microstrip line typically including a strip conductor disposed on the top of a substrate, said method comprising the steps of:

inserting a layer of dielectric material between said strip conductor and said substrate, wherein said dielectric layer has a dielectric constant which is less than the dielectric constant of said substrate, and etching said dielectric layer so that it has a width no greater than the width of said strip conductor.

* * * * *